(12) United States Patent
Yan et al.

(10) Patent No.: US 12,220,780 B2
(45) Date of Patent: Feb. 11, 2025

(54) MATERIAL CARRYING DEVICE AND LOCATING ASSEMBLY

(71) Applicants: Henan Fuchi Technology Co., Ltd., Zhengzhou (CN); HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Yan-Fang Yan, Zhengzhou (CN); Hai-Qiang Li, Zhengzhou (CN); Dun-Jiu Xiang, Zhengzhou (CN)

(73) Assignees: Henan Fuchi Technology Co., Ltd., Zhengzhou (CN); HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 308 days.

(21) Appl. No.: 17/861,460

(22) Filed: Jul. 11, 2022

(65) Prior Publication Data
US 2023/0264311 A1 Aug. 24, 2023

(30) Foreign Application Priority Data
Feb. 18, 2022 (CN) .......................... 202210151696.2

(51) Int. Cl.
*B23Q 7/14* (2006.01)
*B65G 1/02* (2006.01)
*B65G 1/10* (2006.01)

(52) U.S. Cl.
CPC .......... *B23Q 7/1426* (2013.01); *B65G 1/026* (2013.01); *B65G 1/10* (2013.01)

(58) Field of Classification Search
CPC ........ B23Q 7/1426; B65G 1/026; B65G 1/10; H05K 13/021; Y02P 70/50; B65D 25/04; B65D 25/00; B65D 25/10; B65D 25/24; B65D 85/00; A47B 2097/008
See application file for complete search history.

(56) References Cited

U.S. PATENT DOCUMENTS

| | | | | |
|---|---|---|---|---|
| 1,075,652 A | * | 10/1913 | Kleber, Jr. ............. | A47B 63/02 312/351 |
| 3,464,748 A | * | 9/1969 | Gregory .................... | A47F 7/00 211/40 |
| 4,867,318 A | * | 9/1989 | Robson ................... | A47F 5/005 211/41.12 |

(Continued)

*Primary Examiner* — Stanton L Krycinski
(74) *Attorney, Agent, or Firm* — ScienBiziP, P.C.

(57) ABSTRACT

A device for carrying materials in a manner allowing for easy loading but effective capture in location when loaded includes a frame, a carrying assembly positioned on the frame, a locating assembly, and a driving assembly. A connecting rod of the locating assembly is movably positioned on the frame and a first bracket of the locating assembly is positioned at an inlet side of the carrying assembly. The driving assembly drives the connecting rod and a first limiting rod swings synchronously with the connecting rod, to close the carrying assembly when loaded, preventing materials from accidentally falling out of the carrying assembly when it is tilted or jarred.

17 Claims, 8 Drawing Sheets

(56) References Cited

U.S. PATENT DOCUMENTS

| | | | | |
|---|---|---|---|---|
| 4,889,397 | A * | 12/1989 | Ryan | A47B 57/58 |
| | | | | 312/193 |
| 5,038,689 | A * | 8/1991 | Duffy | A47B 47/00 |
| | | | | 211/183 |
| 5,181,622 | A * | 1/1993 | Hallgrimsson | A47B 96/061 |
| | | | | 211/183 |
| 5,588,724 | A * | 12/1996 | Emery | F25D 21/14 |
| | | | | 312/236 |
| 5,860,535 | A * | 1/1999 | Brown | A47B 97/00 |
| | | | | 211/184 |
| 6,641,236 | B2 * | 11/2003 | Grudzien | A47B 88/944 |
| | | | | 312/216 |
| 7,156,475 | B2 * | 1/2007 | Gloger, Jr. | B62B 3/006 |
| | | | | 312/249.11 |
| 7,850,022 | B2 * | 12/2010 | Fulmer | H05K 7/1425 |
| | | | | 211/186 |
| 8,094,035 | B2 * | 1/2012 | Lane, Jr. | B65G 1/02 |
| | | | | 340/686.2 |
| 8,359,986 | B2 * | 1/2013 | Sekiguchi | E05G 1/06 |
| | | | | 109/57 |
| 9,107,501 | B2 * | 8/2015 | Nagy | A47B 96/00 |
| 9,345,342 | B1 * | 5/2016 | Nagy | B65G 1/02 |
| 2004/0080105 | A1 * | 4/2004 | Stevenson | B07C 7/02 |
| | | | | 271/278 |
| 2011/0068943 | A1 * | 3/2011 | Lane, Jr. | B65G 43/00 |
| | | | | 211/183 |

* cited by examiner

MATERIAL CARRYING DEVICE AND LOCATING ASSEMBLY

FIELD

The subject matter herein relates to technical field of material handling, especially relates to a material carrying device and a locating assembly.

BACKGROUND

In a production line, for example, in an automatic feeding process of SMT Mounter, trays for old and new materials need to be stored and held in reserve temporarily. In existing equipment, most of the material trays are simply placed on a machine table, which is prone to accidents and accidental handling, affecting work efficiency of the production line and bringing potential safety hazards to the production workshop.

SUMMARY

The present disclosure provides a device for carrying materials securely and a locating assembly to solve the problem of accidental damage to the material trays.

A material carrying device of an embodiment of the present disclosure includes a frame, a carrying assembly, a locating assembly, and a driving assembly. the carrying assembly is configured for carrying materials, and is positioned on the frame. The locating assembly is positioned at an inlet side of the carrying assembly, and the locating assembly includes a connecting rod, a first supporting rod, a first limiting rod, a first bracket, a first connecting member, and a second connecting member. The connecting rod is movably positioned at a side of the frame. The first bracket is connected to the frame and positioned at the inlet side of the carrying assembly. The first supporting rod is rotationally connected to the first bracket. The first limiting rod is spaced from the first supporting rod, and the ends of the first connecting member are connected with the first limiting rod and the first supporting rod. An end of the second connecting member is connected with the first supporting rod, other end of the second connecting member is rotationally connected with the connecting rod. An axis of the first connecting member is arranged at an angle with an axis of the second connecting member. The driving assembly is connected with the connecting rod to drive the connecting rod. The first limiting rod swings synchronously with the movement of the connecting rod.

In the material carrying device of the present disclosure, the driving assembly drives the limiting rod to swing through a transmission connection with the connecting rod, bracket, supporting rod and limiting rod, so as to open or close the carrying assembly, facilitate the loading of materials onto the carrying assembly, prevent shedding of material from the carrying assembly, and improve work efficiency and safety standards compared to existing trays.

An embodiment of the present disclosure also provides a locating assembly, the locating assembly includes a connecting rod, a first supporting rod, a first limiting rod, a first bracket, a first connecting member, a second connecting member, and a driving assembly. The first supporting rod is rotationally connected to the first bracket, the first limiting rod is spaced from the first supporting rod, and ends of the first connecting member are connected with the first limiting rod and the first supporting rod. An end of the second connecting member is connected with the first supporting rod, other end of the second connecting member is rotationally connected with the connecting rod, and an axis of the first connecting member is arranged at an angle with an axis of the second connecting member. The driving assembly is connected with the connecting rod to drive the connecting rod, the first limiting rod swings synchronously with the movement of the connecting rod.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DESCRIPTION OF MAIN COMPONENTS OR ELEMENTS

Material carrying device 100;
Material 200;
Frame 10;
Carrying assembly 20;
First carrying rod 21;
Second carrying rod 22;
Spacer 23;
Third carrying rod 24;
Fourth carrying rod 25;
Locating assembly 30;
Connecting rod 31;
Positioning groove 311;
Crank 312;
First supporting rod 32;
First limiting rod 33;
First bracket 34;
First connecting member 35;
Second connecting member 36;
Connecting bar 361;
Connecting block 362;
Second bracket 37;
Second supporting rod 38;
Second limiting rod 39;
Transmission rod 41;
Positioning piece 42;
Elastic member 43
Abutting rod 44
Driving assembly 50;
Cylinder 51;
Push rod 52;
Base 60;

Slide 61;
Guiding piece 62;
Roller 63;
Leveling assembly 70;
base plate 71;
First adjusting rod 72;
Second adjusting rod 73;
Rotating member 74

DETAILED DESCRIPTION

In order to make the above-mentioned objects, features, and advantages of the present disclosure more obvious, a description of specific embodiments of the present disclosure will be described with reference to the accompanying drawings. The present disclosure can be implemented in many ways different from those described herein, and those skilled in the art can make similar improvements without violating the contents of the present disclosure. Therefore, the present disclosure is not to be considered as limiting the scope of the embodiments to those described herein.

Several definitions that apply throughout this disclosure will now be presented.

Unless otherwise defined, all technical and scientific terms used herein have the same meaning as commonly understood by one skilled in the art. The terms used in the present disclosure herein are only for describing specific embodiments, and are not intended to limit the present disclosure.

Figure 1:
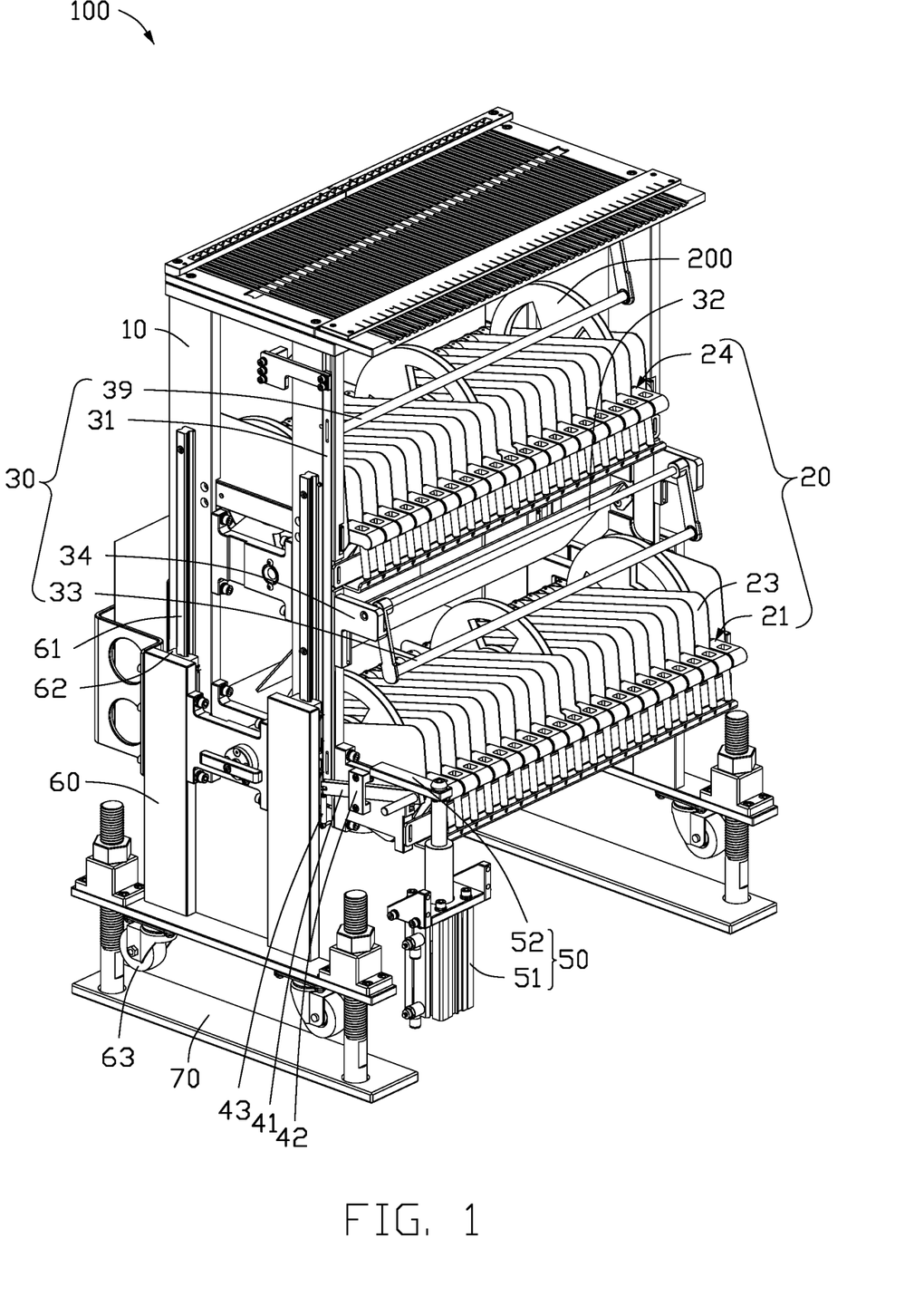
FIG. 1 is a schematic view of a device for carrying materials in an embodiment according to the present disclosure.
Figure 2:
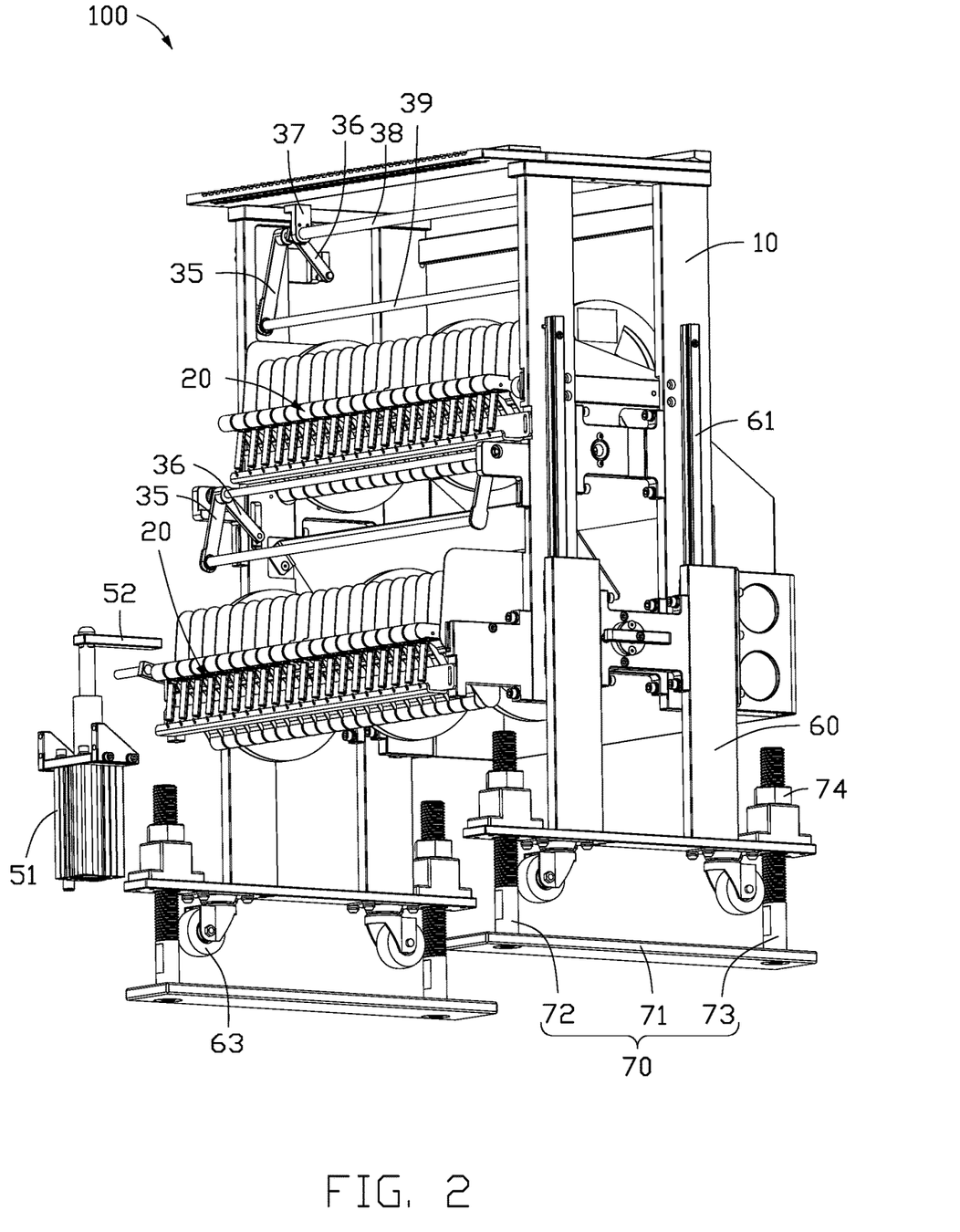
FIG. 2 is another view of the material carrying device of FIG. 1.

Referring to FIG. 1 and FIG. 2, in an embodiment of the present disclosure, a material carrying device 100 includes a frame 10, a carrying assembly 20, a locating assembly 30, and a driving assembly 50. The carrying assembly 20 is arranged on the frame 10 for loading materials 200. The locating assembly 30 is arranged on an inlet side of the carrying assembly 20 to prevent material 200 in the carrying assembly 20 from falling off or falling away. The driving assembly 50 drives the locating assembly 30 to move, in so doing the carrying assembly 20 is opened or closed. Loading of material 200 onto the carrying assembly 20 made easier, and the locating assembly 30 also prevents material 200 from accidentally falling out of the carrying assembly 20.

Figure 8:
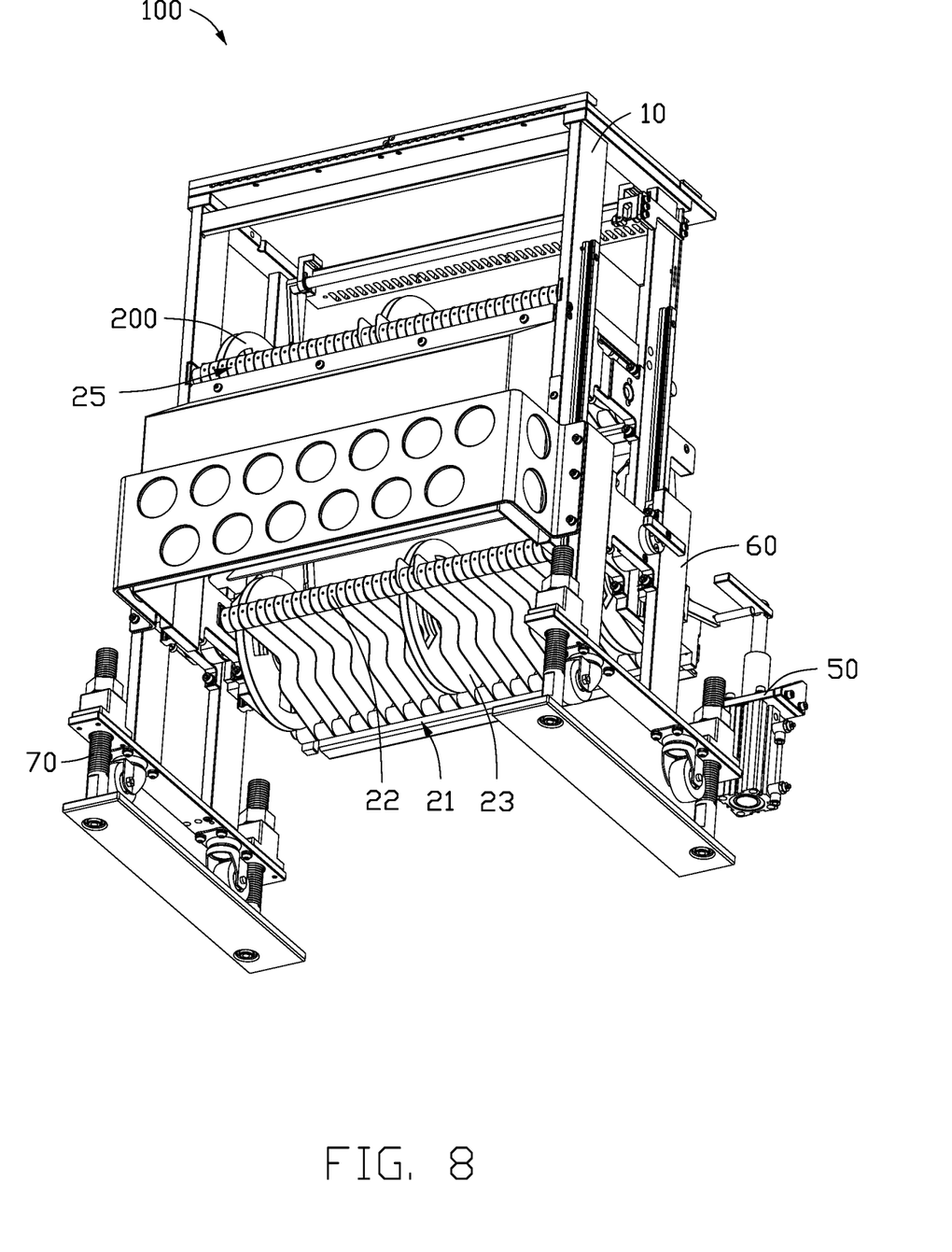
FIG. 8 is a bottom view of the material carrying device of FIG. 1.

Referring to FIG. 1, FIG. 2, and FIG. 8, the carrying assembly 20 includes a first carrying rod 21, a second carrying rod 22, and a plurality of spacers 23. The first carrying rod 21 and the second carrying rod 22 are arranged on the frame 10 at intervals, and the spacers 23 are installed at intervals between the first carrying rod 21 and the second carrying rod 22. The material 200 is generally in a disk structure or form, and a distance between the first carrying rod 21 and the second carrying rod 22 is less than a diameter of the material 200 in disk form, so that when the material 200 is loaded to the carrying assembly 20, the first carrying rod 21 and the second carrying rod 22 are used to support the material 200. One or more disks of the materials 200 are placed between adjacent spacers 23, which can be used to separate and support the materials 200 and reduce the problem of accidental shedding of the materials 200 due to tilting.

Furthermore, the carrying assembly 20 includes a third carrying rod 24 and a fourth carrying rod 25 arranged at intervals. The third carrying rod 24 and the fourth carrying rod 25 are arranged on the frame 10 and are above the first carrying rod 21 and the second carrying rod 22. Spacers 23 are also installed at intervals between the third carrying rod 24 and the fourth carrying rod 25, so that the carrying assembly 20 forms an upper and lower material storage structure and increases the capacity of the material carrying device 100. Furthermore, the third carrying rod 24 and the fourth carrying rod 25 are staggered with the first carrying rod 21 and the second carrying rod 22 respectively, so that the lower material storage structure protrudes from the upper material storage structure, so as to prevent the upper material storage structure from blocking the feeding space of the lower material storage structure. The upper material storage structure stores material 200 not yet used or processed and the lower material storage structure can be used to store material 200 which has been used or processed, which is conducive to improve the work efficiency of the production line.

Referring to FIG. 1, FIG. 2, FIG. 3, and FIG. 4, the locating assembly 30 includes a connecting rod 31, a first supporting rod 32, a first limiting rod 33, a first bracket 34, a first connecting member 35, and a second connecting member 36. In the embodiment of the present embodiment, there are two first brackets 34 two first connecting member 35 and two second connecting members 36. The connecting rod 31 is movably arranged on a side of the frame 10, and the first bracket 34 is fixedly installed on the frame 10 and located on an inlet side of the lower material storage structure in the carrying assembly 20. Specifically, the first bracket 34 is located between the first carrying rod 21 and the third carrying rod 24. The first supporting rod 32 is rotationally connected to the first bracket 34, and two first connecting members 35 are respectively arranged at two ends of the first supporting rod 32. The first limiting rod 33 and the first supporting rod 32 are arranged at intervals, and the ends of the first connecting member 35 connect with the first limiting rod 33 and the first supporting rod 32, so that when the first supporting rod 32 rotates, the first limiting rod 33 is driven to swing through the first connecting member 35. Therefore, when the material 200 is loaded into the carrying assembly 20, a range of movement of the material 200 can be limited by the first limiting rod 33 to avoid accidental shedding. One end of the second connecting member 36 is connected with the first supporting rod 32, and the other end of the second connecting member 36 is rotationally connected with the connecting rod 31. The first connecting member 35 is arranged at an acute angle with the second connecting member 36. When the connecting rod 31 moves up and down, the first supporting rod 32 can be driven to rotate through the second connecting member 36, so as to make the first limiting rod 33 swing synchronously.

In other embodiment of the present disclosure, the driving assembly 50 may be a part of the locating assembly 30. The driving assembly 50 is connected with the connecting rod 31 to drive the connecting rod 31, and the first limiting rod 33 swings synchronously with the movement of the connecting rod 31.

Figure 3:
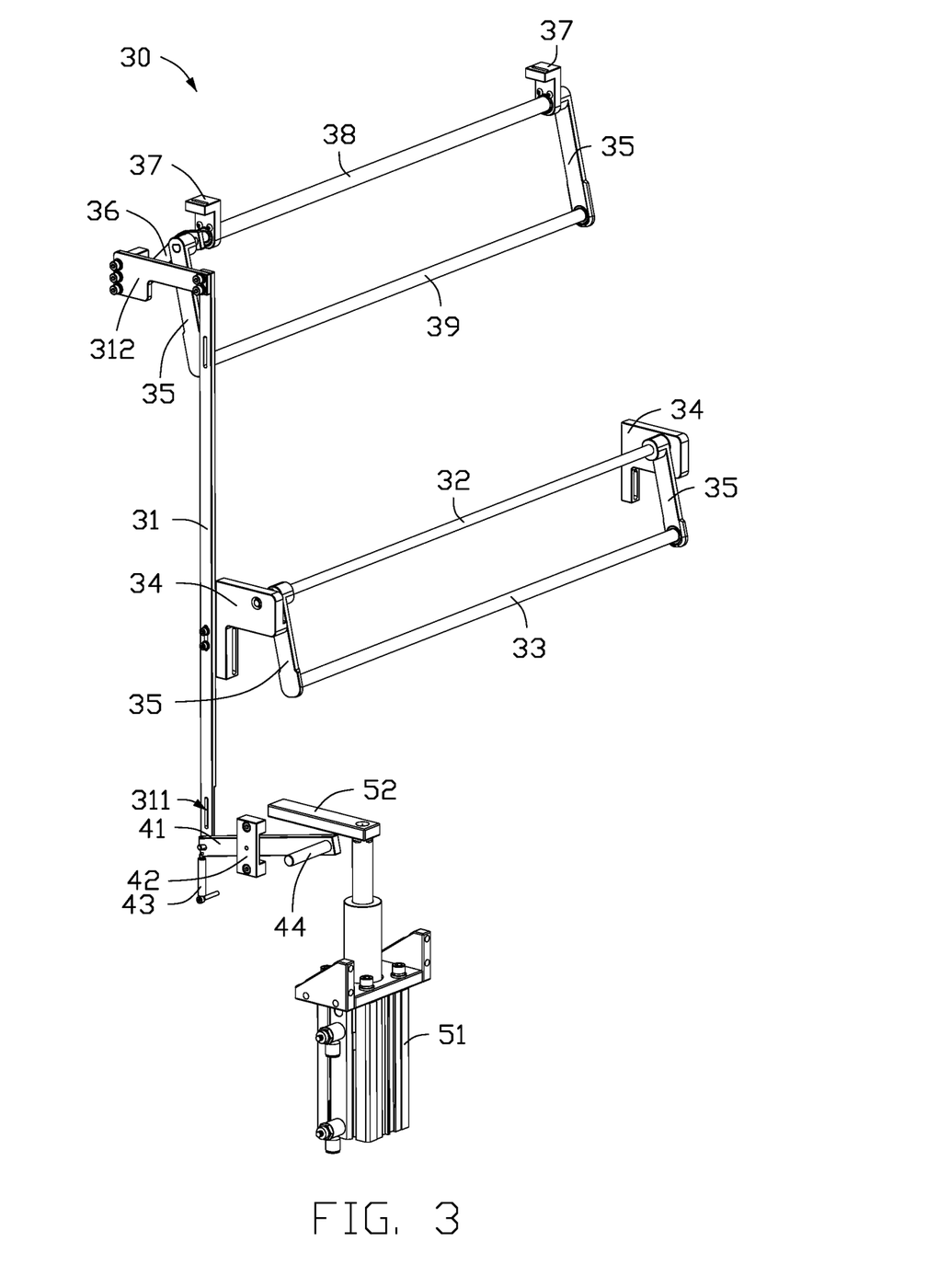
FIG. 3 is a schematic view of a locating assembly.
Figure 4:
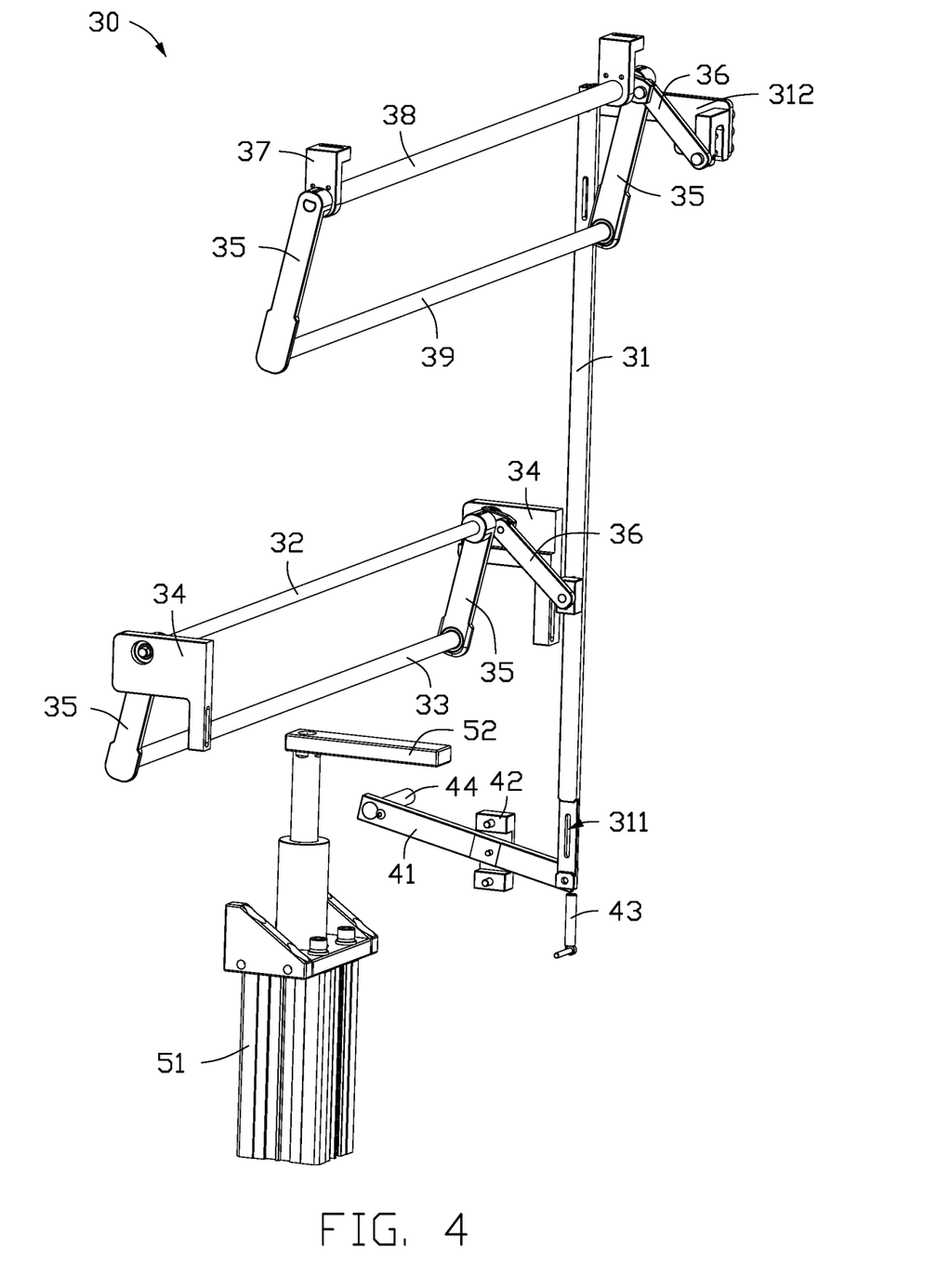
FIG. 4 is a schematic view of the locating assembly of FIG. 3.

Furthermore, the locating assembly 30 also includes two other first connecting members 35, another second connecting member 36, a second supporting rod 38, a second limiting rod 39, and a second bracket 37. In an embodiment of the present disclosure, there are two second brackets 37 fixed on a top portion of the frame 10. The second supporting rod 38 is rotationally connected with the second bracket 37. The second supporting rod 38 and the second limiting rod 39 are arranged at intervals. Another first connecting member 35 is also fixedly connected between the second limiting rod 39 and the second supporting rod 38 to make the second limiting rod 39 swing with the rotation of the second supporting rod 38. The second limiting rod 39 is located at an inlet side of the upper material storage structure in the carrying assembly 20. A crank 312 is fixedly connected at an end of the connecting rod 31. One end of the other second connecting member 36 is rotatably connected with the crank 312, and the far end is fixedly connected with the second supporting rod 38. When the connecting rod 31 moves up and down, the connecting rod 31 can drive the second supporting rod 38 to rotate through the crank 312 and the second connecting member 36, and further drive the second limiting rod 39 to swing by the first connecting member 35. Therefore, materials 200 positioned on the third carrying rod 24 and the fourth carrying rod 25 are locked in place.

Furthermore, the material carrying device 100 includes a transmission rod 41, one end of the transmission rod 41 is rotationally connected with an end of the connecting rod 31 close to the driving assembly 50, and the other end of the transmission rod 41 abuts the driving assembly 50. A positioning piece 42 is fixedly positioned on the frame 10, the positioning piece 42 is arranged at intervals with the connecting rod 31, and the transmission rod 41 is rotationally connected with the positioning piece 42. Therefore, the connecting rod 31, the positioning piece 42, the transmission rod 41 and the driving assembly 50 form a lever structure. When the driving assembly 50 abuts the transmission rod 41 and drives the transmission rod 41 to rotate, the transmission rod 41 drives the connecting rod 31 to move up and down. The material carrying device 100 further includes an elastic member 43. An end of the elastic member 43 is connected to a bottom end of the connecting rod 31, and other end of the elastic member 43 is fixedly connected to the frame 10. The elastic member 43 is configured to pull on the connecting rod 31 to reset it.

The connecting rod 31 is further defined with a positioning groove 311, and the frame 10 is provided with a protrusion corresponding to the positioning groove 311.

When the connecting rod 31 moves up and down, the protrusion can slide in the positioning groove 311 relative to the connecting rod 31, to guide movement of the connecting rod 31 and limit a moving range of the connecting rod 31.

Figure 5:
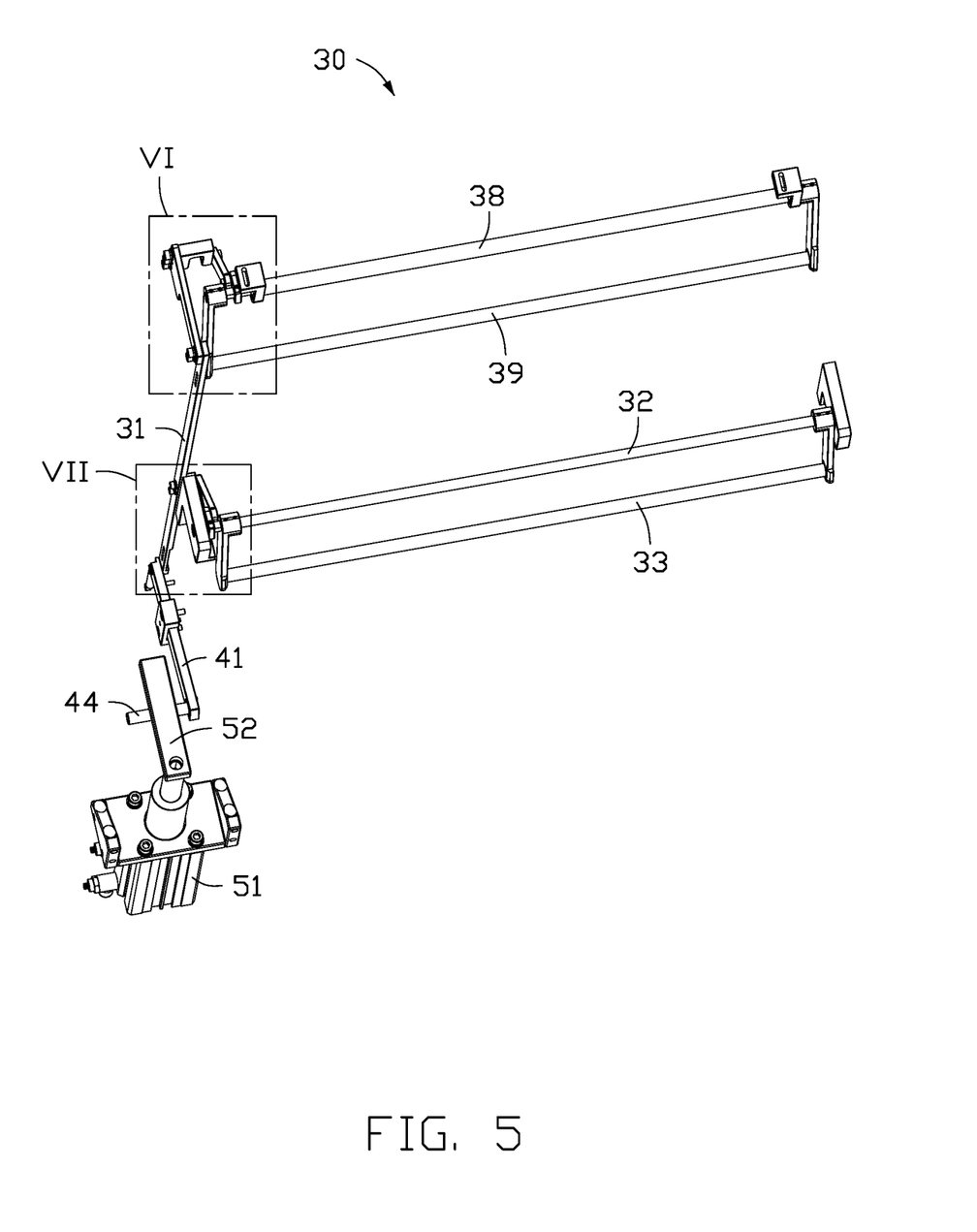
FIG. 5 is a top view of the locating assembly of FIG. 3.
Figure 6:
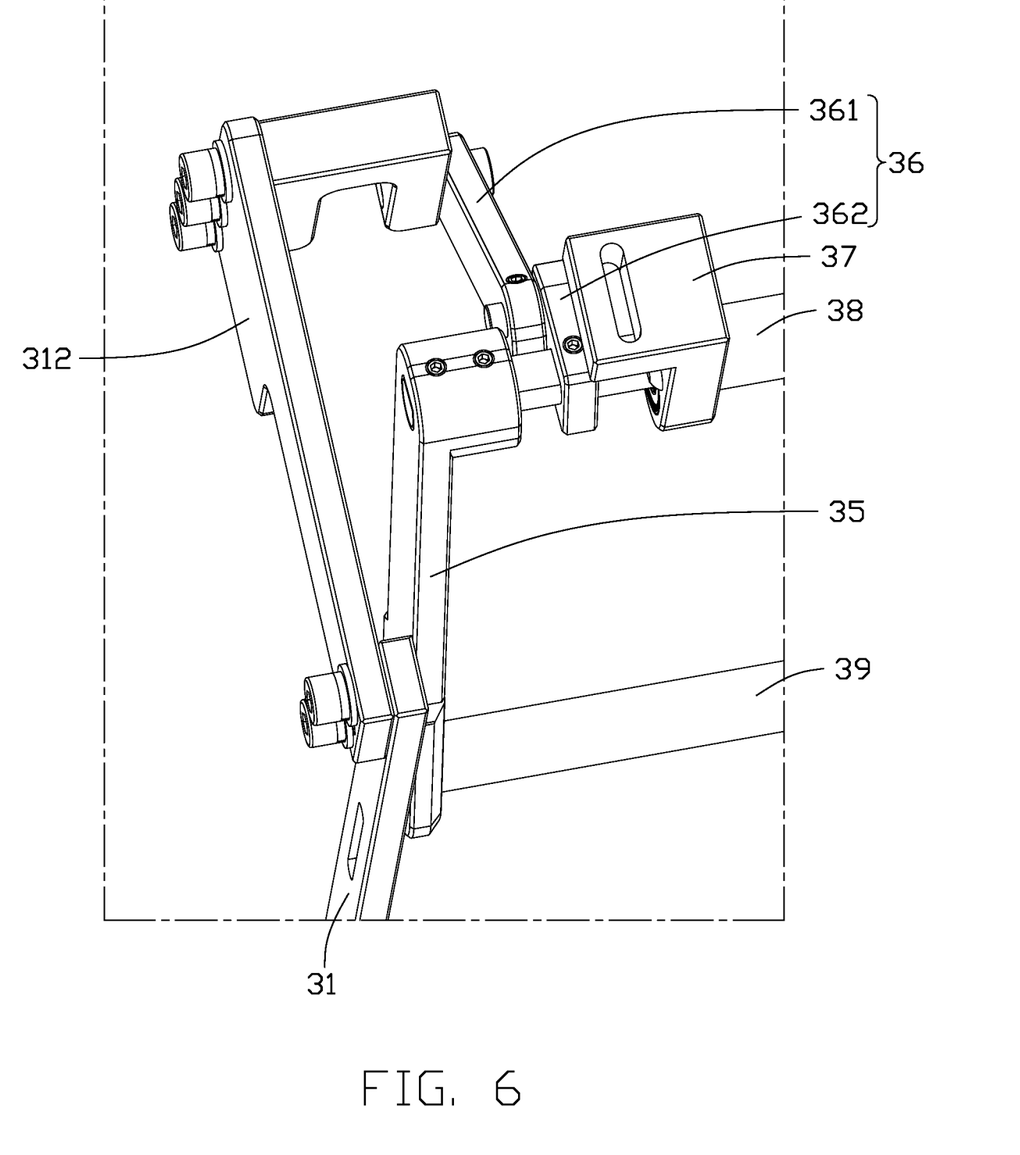
FIG. 6 is an enlarged view of the locating assembly of FIG. 5.
Figure 7:
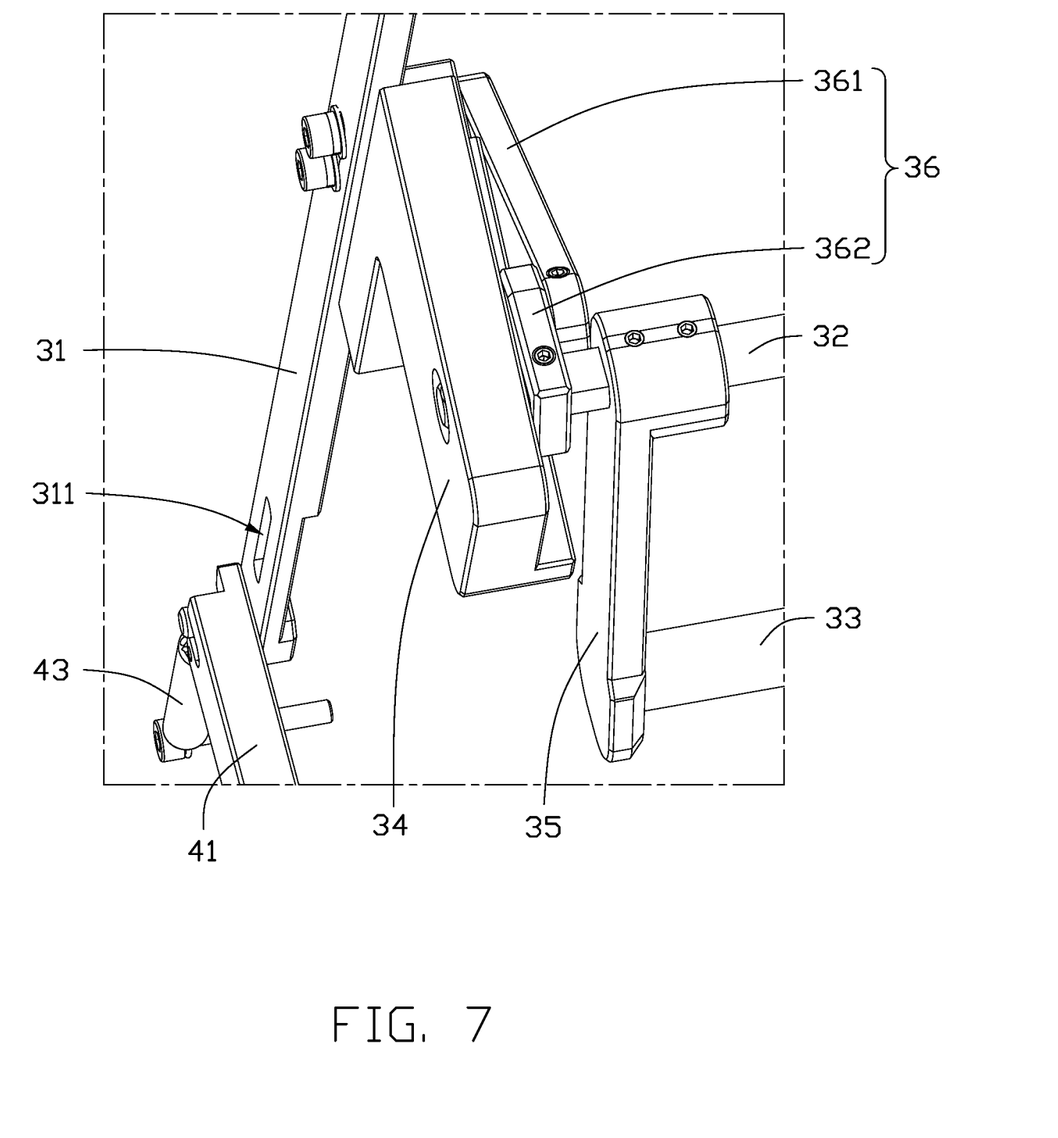
FIG. 7 is another enlarged view of the locating assembly of FIG. 5.

Referring to FIG. 5, FIG. 6, and FIG. 7, in an embodiment of the present disclosure, two first brackets 34 are symmetrically arranged on both sides of the frame 10, and the first supporting rod 32 is rotationally connected between the two first brackets 34. Two first connecting members 35 are fixedly connected to the ends of the first supporting rod 32 and the first limiting rod 33. The second connecting member 36 includes a connecting bar 361 and a connecting block 362. The connecting block 362 is fixedly connected at an end of the first supporting rod 32, the ends of the connecting bar 361 are connected with the connecting block 362 and the connecting rod 31, and the connecting bar 361 is arranged at an angle with the first connecting member 35. When the connecting rod 31 moves up and down, the connecting block 362 is driven to rotate through the connecting bar 361, the first supporting rod 32 rotates synchronously with the connecting block 362, and the first limiting rod 33 swings with the rotation of the first supporting rod 32 through the first connecting member 35.

Referring to FIG. 3 and FIG. 4, the driving assembly 50 makes a transmission connection with the connecting rod 31 through the transmission rod 41. The driving assembly 50 is used to drive the connecting rod 31 to move. The first limiting rod 33 and the second limiting rod 39 swing synchronously with the movement of the connecting rod 31 to limit the range of movement of the material 200 in the carrying assembly 20. The driving assembly 50 includes a cylinder 51 and a push rod 52. One end of the push rod 52 is connected with the cylinder 51, other end of the push rod 52 abuts the transmission rod 41. Furthermore, an abutting rod 44 is positioned at the end of the transmission rod 41 towards the driving assembly 50. When the push rod 52 moves down, the push rod 52 can press the abutting rod 44 to move the connecting rod 31, lifting the first and second limiting rods 33 and 39 to allow material 200 to be loaded into the carrying assembly 20. Then, the cylinder 51 drives the push rod 52 to move up, to separate the push rod 52 from the abutting rod 44, the connecting rod 31 is reset by tension of the elastic member 43. The first limiting rod 33 and the second limiting rod 39 return to the inlet side of the carrying assembly 20 to block the material 200 and limit the range of movement of the material 200 in the carrying assembly 20.

Referring to FIG. 1 and FIG. 2, the material carrying device 100 further includes a base 60. The frame 10 is installed on the base 60. Slides 61 are positioned at sides of the frame 10, and the base 60 is provided with guiding pieces 62 corresponding to the slides 61. The guiding pieces 62 are movably connected with the slides 61, so that the frame 10 can move relative to the base 60 to adjust a height of the material carrying device 100 and adapt to different use environments. The base 60 also includes rollers 63, which can facilitate the transfer of the material carrying device 100.

Furthermore, the material carrying device 100 includes a leveling assembly 70. The leveling assembly 70 is arranged below the base 60 to adjust a levelness of the material carrying device 100. The leveling assembly 70 includes a base plate 71, a first adjusting rod 72, a second adjusting rod 73, and rotating members 74. The first adjusting rod 72 and the second adjusting rod 73 are arranged on the base plate 71 at intervals, the first adjusting rod 72 and the second adjusting rod 73 pass through the base 60, and the rotating members 74 are rotationally connected to a side of the base 60 away from the base plate 71. Two rotating members 74 are threaded with the first adjusting rod 72 and the second adjusting rod 73. Rotating the rotating member 74 changes the positions of the rotating members 74 on the first adjusting rod 72 and the second adjusting rod 73, so as to adjust the levelness of the base 60.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A material carrying device comprising:
    a frame;
    a carrying assembly for carrying materials, positioned on the frame;
    a locating assembly, positioned at an inlet side of the carrying assembly, wherein the locating assembly comprises a connecting rod, a first supporting rod, a first limiting rod, a first bracket, a first connecting member, and a second connecting member; the connecting rod is movably positioned at a side of the frame, the first bracket is connected to the frame and positioned at the inlet side of the carrying assembly, the first supporting rod is rotationally connected to the first bracket, the first limiting rod is spaced from the first supporting rod, and both ends of the first connecting member are connected with the first limiting rod and the first supporting rod respectively, an end of the second connecting member is connected with the first supporting rod, an other end of the second connecting member is rotationally connected with the connecting rod, an axis of the first connecting member is arranged at an angle with an axis of the second connecting member; and a driving assembly, is connected with the connecting rod to drive the connecting rod, the first limiting rod swings synchronously with the movement of the connecting rod.

2. The material carrying device of claim 1, wherein the material carrying device further comprises a transmission rod, one end of the transmission rod is rotatably connected to the connecting rod, the other end of the transmission rod abuts the driving assembly.

3. The material carrying device of claim 2, wherein a positioning piece is fixed on the frame, the positioning piece is spaced from the connecting rod, and the transmission rod is rotatably connected to the positioning piece.

4. The material carrying device of claim 2, wherein the material carrying device further comprises an elastic member, an end of the elastic member is connected to a bottom end of the connecting rod, an other end of the elastic member is fixed at the frame.

5. The material carrying device of claim 1, wherein a positioning groove is defined on the connecting rod, a protrusion is positioned at the side of the frame, the protrusion is movably positioned in the positioning groove.

6. The material carrying device of claim 4, wherein the carrying assembly comprises:
a first carrying rod, positioned on the frame;
a second carrying rod, positioned on the frame, and is spaced from the first carrying rod; and
a plurality of spacers, positioned between the first carrying rod and the second carrying rod.

7. The material carrying device of claim 1, wherein the locating assembly further comprises another second connecting member, a second supporting rod, a second limiting rod, and a second bracket; the second bracket is fixed at a top portion of the frame, the second supporting rod is rotatably connected to the second bracket, the second supporting rod is spaced from the second limiting rod, and another first connecting member is connected between the second limiting rod and the second supporting rod;
a crank is connected to the connecting rod, an end of the second connecting member is connected to the crank, another end of the second connecting member is connected to the second supporting rod.

8. The material carrying device of claim 4, wherein the driving assembly comprises a cylinder and a push rod, an end of the push rod is connected to the cylinder, an other end of the push rod abuts the transmission rod.

9. The material carrying device of claim 8, wherein the material carrying device further comprises a base, the frame is arranged on the base;
a slide is positioned at the side of the frame, a guiding piece is positioned on the base, and the guiding piece is movably connected to the slide.

10. The material carrying device of claim 9, wherein the material carrying device further comprises a leveling assembly, the leveling assembly is arranged below the base for adjusting a levelness of the material carrying device;
the leveling assembly comprises a base plate, a first adjusting rod, a second adjusting rod, and two rotating members, the first adjusting rod and the second adjusting rod are arranged on the base plate, and spaced apart, the first adjusting rod and the second adjusting rod pass through the base, the rotating members are rotatably connected to a side of the base away from the base plate, and two rotating members are threaded connected with the first adjusting rod and the second adjusting rod respectively.

11. A locating assembly comprising:
a connecting rod;
a first supporting rod;
a first limiting rod;
a first bracket;
a first connecting member; and
a second connecting member; wherein the first supporting rod is rotationally connected to the first bracket, the first limiting rod is spaced from the first supporting rod, and both ends of the first connecting member are connected with the first limiting rod and the first supporting rod respectively, an end of the second connecting member is connected with the first supporting rod, an other end of the second connecting member is rotationally connected with the connecting rod, an axis of the first connecting member is arranged at an angle with an axis of the second connecting member; and
a driving assembly, is connected with the connecting rod to drive the connecting rod, the first limiting rod swings synchronously with the movement of the connecting rod.

12. The locating assembly of claim 11, wherein the locating assembly further comprises a transmission rod, one end of the transmission rod is rotatably connected to the connecting rod, the other end of the transmission rod abuts the driving assembly.

13. The locating assembly of claim 12, wherein the locating assembly further comprises a positioning piece, the positioning piece is spaced from the connecting rod, and the transmission rod is rotatably connected to the positioning piece.

14. The locating assembly of claim 12, wherein the locating assembly further comprises an elastic member, an end of the elastic member is connected to a bottom end of the connecting rod.

15. The locating assembly of claim 11, wherein a positioning groove is defined on the connecting rod.

16. The locating assembly of claim 11, wherein the locating assembly further comprises another second connecting member, a second supporting rod, a second limiting rod, and a second bracket; the second bracket is spaced from the first bracket, the second supporting rod is rotatably connected to the second bracket, the second supporting rod is spaced from the second limiting rod, and another first connecting member is connected between the second limiting rod and the second supporting rod;
a crank is connected to the connecting rod, an end of the second connecting member is connected to the crank, another end of the second connecting member is connected to the second supporting rod.

17. The locating assembly of claim 14, wherein the driving assembly comprises a cylinder and a push rod, an end of the push rod is connected to the cylinder, an other end of the push rod abuts the transmission rod.

* * * * *